(12) United States Patent
Han et al.

(10) Patent No.: US 7,442,926 B2
(45) Date of Patent: Oct. 28, 2008

(54) NANO TIP AND FABRICATION METHOD OF THE SAME

(75) Inventors: Chang-Soo Han, Daejeon (KR); June-Ki Park, Daejeon (KR)

(73) Assignee: Korea Institute of Machinery & Materials, Dae-Jeon (KR)

( * ) Notice: Subject to any disclaimer, the term of this patent is extended or adjusted under 35 U.S.C. 154(b) by 313 days.

(21) Appl. No.: 11/506,826

(22) Filed: Aug. 21, 2006

(65) Prior Publication Data
US 2007/0114457 A1  May 24, 2007

(30) Foreign Application Priority Data
Aug. 19, 2005  (KR) ..................... 10-2005-0076283

(51) Int. Cl.
B82B 3/00 (2006.01)
G12B 21/02 (2006.01)

(52) U.S. Cl. .................... 250/307; 250/306; 73/105; 977/876

(58) Field of Classification Search ............. 250/306, 250/307; 73/105; 977/876
See application file for complete search history.

(56) References Cited

U.S. PATENT DOCUMENTS

| | | | |
|---|---|---|---|
| 6,346,189 B1 | 2/2002 | Dai et al. | |
| 6,401,526 B1 | 6/2002 | Dai et al. | |
| 6,457,350 B1 * | 10/2002 | Mitchell | ....................... 73/105 |
| 7,053,520 B2 * | 5/2006 | Zetti et al. | ................... 310/309 |

FOREIGN PATENT DOCUMENTS

JP   2002-162337   6/2002

OTHER PUBLICATIONS

Zhang et al., "Filling of single-walled carbon nanotubes with silver", Journal of Materials Research, vol. 15, No. 12, Dec. 2000, pp. 2658-2661.*
Yenilmez et al., Wafer scale production of carbon nanotube scanning probe tips for atomic force microscopy, Applied Physics letters, vol. 80, No. 12, Mar. 2002, pp. 2225-2227.

* cited by examiner

*Primary Examiner*—Jack I Berman
(74) *Attorney, Agent, or Firm*—Pearl Cohen Zedek Latzer LLP

(57) ABSTRACT

The present invention relates to a nano tip and a fabrication method of the nano tip that is generally usable in mechanical, physical, and electrical devices for detecting surface signals or chemical signals, or is usable for a source scanning energy beam.

The fabrication method of a nano tip according to the present invention includes providing a supporting holder that is fixed at one end thereof to a mechanical or electrical device, bonding a carbon nanotube to the free end of the supporting holder, and modifying the property or the shape of the carbon nanotube by scanning an energy beam thereto.

The nano tip, having improved stiffness and perpendicularity, is fabricated by adjusting the length, the diameter, and the shape of the end of the carbon nanotube tip attached with carbon nanotubes by means of the energy beam so that the nano tip may stably and repeatedly reproduce information of a sample and may minimize a deviation between the tips.

13 Claims, 10 Drawing Sheets

(A)  (B)

(A)

(B)

US 7,442,926 B2

NANO TIP AND FABRICATION METHOD OF THE SAME

CROSS-REFERENCE TO RELATED APPLICATIONS

The present application claims priority to Korean patent application No. 10-2005-0076283 filed in the Korean Intellectual Property Office on Aug. 19, 2005, and all the benefits accruing therefrom under 35 U.S.C. §119, the contents of which are herein incorporated by reference in their entirety.

BACKGROUND OF THE INVENTION

1. Field of the Invention

The present invention relates to a nano tip and fabrication methods of the nano tip, which is generally used in mechanical, physical, and electrical devices for detecting surface signals or chemical signals, or that may be used as a source of an energy beam. In particular, it relates to a nano tip and fabrication methods of the same that may be used as a probe needle of a scanning probe microscope (SPM) to be able to detect mechanical and chemical action, a needle-type nano probe primarily made of carbon material for application to chemical or biological sensors, or a source of an energy beam such as a cold cathode source scanning X-ray or an electron beam.

2. Description of the Related Art

A scanning probe microscope is a microscope that detects physical and chemical reaction of atoms on the surface of a sample by means of a probe tip attached to its probe. The probe tip serves as a sensor detecting the physical and chemical reaction, and is mounted at the very end of the probe. The structure of the probe depends on what physical quantity is to be detected, and generally a tip with a finer structure may detect a smaller unit of physical quantity. Also, a tip with a particular shape may carry out two-dimensional measurement rather than one-dimensional measurement. Therefore, recently, a carbon nanotube with a diameter of close to 1 nm has been used as the probe tips of the microscopes.

Of the scanning probe microscopes, there are a scanning tunneling microscope (STM) that measures tunnel current, an atomic force microscope (AFM) that detects surface indentation by using Van der Waals atomic force, a lateral force microscope (LFM) that detects a surface difference by friction force, a magnetic force microscope (MFM) that detects characteristics of a magnetic field by using a magnetized needle, an electric field force microscope (EFM) that measures an electrical field by applying a voltage between the sample and the probe, a chemical force microscope (CFM) that measures surface distribution of a chemical functional group, a scanning capacitance microscope (SCM) that measures capacitance between a sample and a probe, a scanning thermal microscope (SThM) that displays distinct images of thermal distribution on the surface, and an electrochemistry scanning probe microscope (EC-SPM) that measures electrochemical properties of a specimen, to name a few. Generally, these microscopes detect surface signals with a high resolution of up to atomic scale.

The AFM is widely used in the various fields of nano-technology from fundamental research to processing equipment for production. The probe tip is regarded as a core technology for the AFM, and the shape and size of the probe tip changes the resolution and reproducibility of images of the AFM. The AFM is widely used in the field of measurement and observation up to nanoscale, and many studies are being carried out on soft lithography using the AFM.

The AFM tip is generally a sharp pyramid-shaped tip formed at the free end of the AFM cantilever. However, the carbon nanotube may be bonded to the apex of the pyramid. This is because a tip with a very high aspect ratio and a small diameter is favorable for measurement in the atomic scale.

The carbon nanotube tip is well-known to have an ideal feature for improving the AFM in measurement, controllability, and manufacturing due to its sharpness, high aspect ratio, high mechanical stiffness, high elasticity, and controllability of chemical components.

The tip made of carbon nanotubes has a long life, is suitable for measuring a narrow and deep structure, and has the advantage of high resolution that is capable of measuring a size smaller than 1 nm.

Recently, it has been reported that multi-walled carbon nanotubes (MWNT) or single walled carbon nanotubes (SWNT) are directly grown by a chemical vapor deposition (CVD) method suggested by Hafner et al. (U.S. Pat. No. 6,346,189). For the individual growth of the AFM probe tips, this method coats catalyst particles and makes them grow in a high temperature hydrocarbon gas. By this method, a bundle of the MWNT or the SWNT is bonded to the end of the AFM.

A method developed by Dai is very effective. In the method, liquid phase precursors are coated on the end of an AFM tip and are grown by the CVD method. After that, the AFM tip attached with the carbon nanotubes is finished through the discharging process for adjusting the size (U.S. Pat. No. 6,401,526). The liquid phase precursor is made by mixing a salt-containing metal, a long-chain molecular compound, and a solvent. Also, in order to attach the phase precursor effectively, a method is provided in which a plurality of pyramid tips are coated at the same time by micro-contact printing.

In addition, it has been recently reported that the carbon nanotubes are grown by spreading a phase precursor on a spin coating at a wafer mounted with many silicon pyramid tips for the AFM, followed by removing the phase precursor by etching it except the phase precursor on the pyramids so as to leave the phase precursor on the tip of the pyramid only, and then using the CVD method in a gas containing carbon (see Wafer scale production of carbon nanotube scanning probe tips for atomic force microscopy, Applied Physics letters, Vol. 80, No. 12, Erhan Yenilmez et al., 2002, March, pp 2225-2227).

In addition, the carbon nanotubes have been bonded to the AFM tip directly with an adhesive, and Piezomax Co. has commercialized the carbon nanotube probe for the AFM by bonding a bundle of MWNTs and grinding the end thereof to be sharp.

Many studies have been carried out to detect mechanical, chemical, and biological features of the AFM probe attached with such carbon nanotubes having excellent aspect ratio and properties. However, it is very difficult to fabricate a nanoscale probe with these carbon nanotubes attached. In particular, previously reported methods take a long time for production in even a small quantity or have the disadvantage that uniform performance is not obtained in mass production. Also, it is nearly impossible to obtain the required length and diameter and to control the shape of the end of the tip. Therefore, when measuring samples, each tip may show the different result so that the tips are not suitable for industrial use.

On the whole, the previous nano tips made by multi-layering carbon have been made inside a scanning electron microscope by gradual deposition and growth at one end of the tip while flowing carbon gas. However, not only does this method requires a lot of time, but it has difficulties in making a very thin tip with a uniform diameter.

State-of-the-art semiconductors have a line width smaller than 0.1 μm, so the AFM is used to measure the width accurately in the process. However, it is difficult for the conventional probe or tip of the AFM to carry out the accurate measurement, and there is a growing need for fabricating nano tips to solve the problem.

On the other hand, the nano tips having carbon nanotubes attached on a conductor have been tested as a beam source of a scanning electron microscope or a beam source for X-rays. However, making a probe with extreme delicacy and reliability is so difficult that its commercialization has not yet been achieved.

SUMMARY OF THE INVENTION

The present invention provides a nano tip and fabrication method of the same of which the length, the perpendicularity, and the shape of the end is controllable in order to not only measure the shapes of various micro structures but also to detect the various physical, chemical, and biological signals.

The fabrication method of a nano tip according to the present invention, the nano tip being attached to a mechanical or electrical device and that is usable for detecting surface signals or biological and chemical signals or is usable as a source of an energy beam, includes: providing a supporting holder fixed at one end thereof to the mechanical or electrical device; bonding a carbon nanotube to the free end of the supporting holder; and modifying the property or the shape of the carbon nanotube by scanning an energy beam thereto.

The carbon nanotube has one lengthwise end thereof fixed to the supporting holder.

The energy beam is controllable in the scanning direction thereof, and may be one selected from the group including an ion beam, an electron beam, and a laser beam.

The energy beam may be scanned to the carbon nanotube such that the whole carbon nanotube is exposed to the energy beam.

By scanning the energy beam to the carbon nanotube, the exposed carbon nanotube may be changed in property from a crystalline to a non-crystalline nano rod. Moreover, the nano rod may be cut by scanning the energy beam to a part of the nano rod.

While cutting the nano rod, a part of the nano rod where the energy beam is focused may be cut off by scanning the energy beam in the lengthwise direction of the nano rod or selectively by scanning the energy beam in the transverse direction with respect to the length of the nano rod from the side of the nano rod to be cut.

Also, by scanning the energy beam to the carbon nanotube, the carbon nanotube may be changed to be smoother on the exposed surface thereof and to a round shape at the end thereof. Further, the carbon nanotube exposed to the energy beam may be changed to be straightened in the lengthwise direction thereof.

Modifying the property or the shape of the carbon nanotube by scanning the energy beam thereto may be cutting the carbon nanotube by scanning the energy beam to a part of the carbon nanotube.

Here, the energy beam is focused at the carbon nanotube to be cut, and a part of the carbon nanotube may be cut off by scanning the energy beam in the lengthwise direction of the carbon nanotube.

Or a part of the carbon nanotube may be cut off by scanning the energy beam in the transverse direction with respect to the length of the carbon nanotube from the side of the carbon nanotube to be cut.

Scanning the energy beam to the carbon nanotube may be modifying the bundle of the carbon nanotubes to a single nano rod by bonding several carbon nanotubes in a bundle shape to the supporting holder and then scanning the energy beam thereto.

The supporting holder may be formed into a conductor so that the nano tip is usable as a source that scans an energy beam.

As explained hereinabove, according to the fabrication method of the nano tip of the present invention, a nano tip having improved stiffness and perpendicularity is fabricated by adjusting the length, the diameter, and the shape of the end of the carbon nanotube tip attached with carbon nanotubes by means of the energy beam so that the nano tip may stably and repeatedly reproduce information of the sample and may minimize a deviation between the tips.

Also, the fabrication method of the present invention is very suitable for commercialization because of the easy and productive process compared to the method to control the size and the shape of the carbon nanotube.

Furthermore, since the carbon nanotube tip may be applied to the physical, chemical, and biological sensors or the electronic components, the fabrication method of the present invention has a variety of applications as a fundamental process technology in the field of nano technology. These are an AFM, an STM, and other SPMs, biological and chemical sensors, and a source of an energy beam for a device scanning X-rays or electron beams to name a few.

DETAILED DESCRIPTION OF THE EMBODIMENTS

In the present specification, the mechanical or electrical device includes a scanning probe microscope that images an array of atoms, a data storage device that processes magnetic information, and sensors that detect biological or chemical signals. The mechanical or electrical device further includes a device to measure force or stress using mechanical deformation, or a scanning probe microscope that is applied for soft lithography that has been much studied recently.

Hereinafter, the embodiments of the present invention will be explained in detail by referring to the appended drawings. Though the explanation is mainly given to an atomic force microscope, a kind of scanning probe microscope, for convenience, the present invention is not limited thereby. It should be understood that the present invention may be applied to various scanning probe microscopes or sensor probes that detect various physical, chemical, and biological signals.

Figure 1:
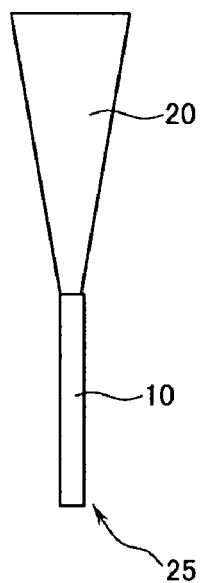
FIG. 1 is a schematic diagram illustrating the structure of a nano tip with a carbon nanotube.

FIG. 1 is a schematic diagram for explaining the structure of a nano tip with carbon nanotubes 10, and shows the structure of the tip formed with a supporting holder 20 to which the carbon nanotubes are bonded or connected. Signals are detected by interaction between the end 25 of the tip and the sample to be measured.

As shown in FIG. 1, the bonding or connection between the carbon nanotube 10 and the supporting holder 20 may be carried out by various practical methods. As a typical method, the dielectrophoresis method is used in which the carbon nanotubes are dispersed in a solution and an electric field is applied thereto so as to assemble the carbon nanotubes 10 at a specific location on the supporting holder 20.

In addition, the carbon nanotubes 10 may be mechanically bonded one by one by a manipulator inside a scanning electron microscope (SEM). Also, in a chemical method such as chemical vapor deposition (CVD), the carbon nanotube 10 may be grown by using a catalyst coated on the end of the supporting holder 20.

In the present specification, the part that one end of the carbon nanotube is attached to and supported by is referred to as the supporting holder. For example, the supporting holder 20 in the AFM may be a tip or a supporter supporting the tip. In other words, the term "supporting holder" represents a probe, and more specifically, it represents a part that the nano rod is bonded to and supported by in the probe of all the mechanical and electrical devices to which the present invention may be applied.

Also, the energy beam that is used in the present invention includes a beam of which the scanning direction and focal point are controllable, such as an electron beam, a laser beam, and an ion beam.

Figure 2:
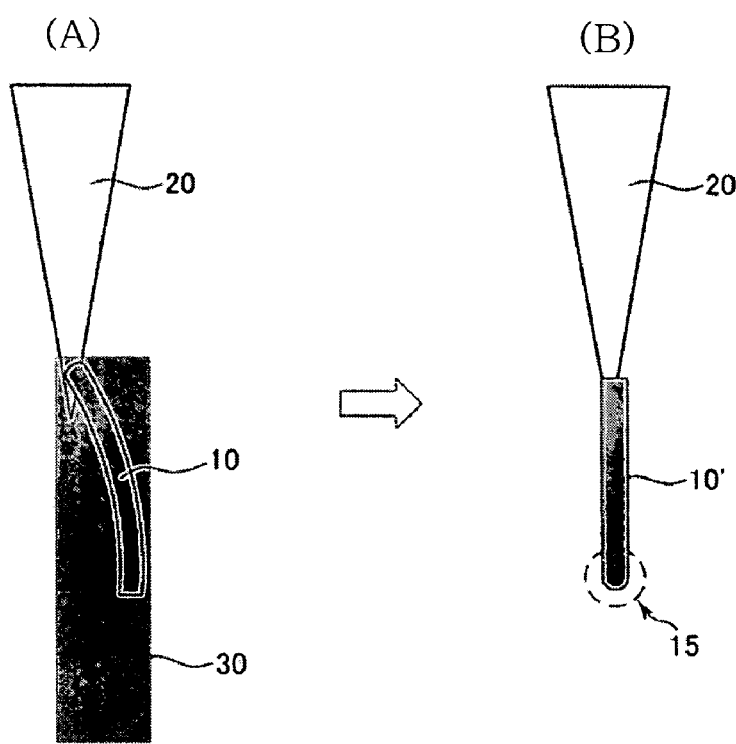
FIGS. 2(A) and 2(B) are schematic diagrams showing the process for improving perpendicularity of the nano tip by an energy beam in the fabrication method of the nano tip according to a first embodiment of the present invention.

FIGS. 2(A) and 2(B) are schematic diagrams showing the process for improving perpendicularity of the nano tip by the energy beam in the fabrication method of the nano tip according to a first embodiment of the present invention.

In the case that the carbon nanotube 10 that is bonded to the supporting holder 20 is curved or has a rough surface, the carbon nanotube 10 changes in shape over time while the energy beam 30 is applied. That is, when the energy beam 30 is applied for a predetermined duration, the carbon nanotube 10 is gradually straightened and may become a smooth surfaced carbon nanotube 10'.

In particular, it has been reported that the carbon nanotube changes from an $sp^2$ to an $sp^3$ structure due to ion bombardment when a focused ion beam (FIB) is scanned to the carbon nanotube. The previous study shows that a hollow carbon nanotube becomes a solid carbon nanotube of which the interior is completely filled in such a changing process.

Therefore, the carbon nanotube on the tip in the present embodiment may change to a carbon-filled solid rod when exposed to the focused ion beam. The crystallization of the carbon nanotube may vary with the intensity of the beam. This process causes the curved carbon nanotube to be straightened, and the perpendicularity is improved thereby.

As for the nano tip of the carbon nanotube, the end of the carbon nanotube is open in many cases, and the shape of the end is not uniform even in the case of a single tip. Such a carbon nanotube may change to have a round end 15 by being exposed to a focused ion beam for a predetermined duration.

Figure 3:
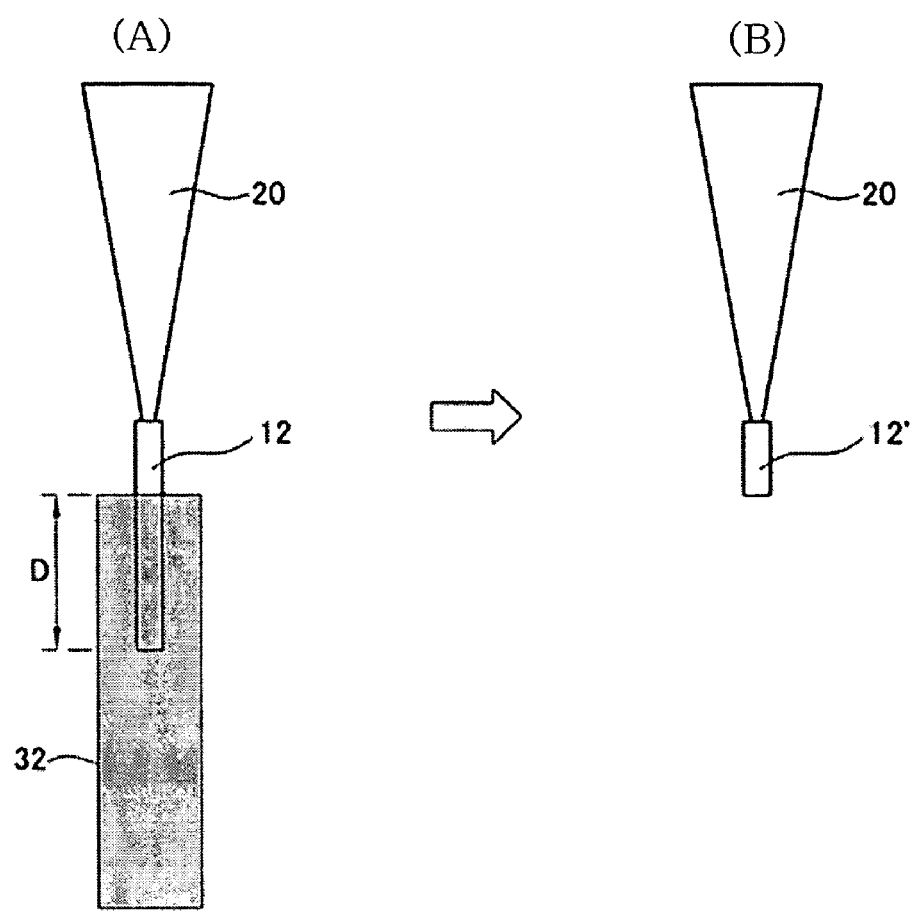
FIGS. 3(A) and 3(B) are schematic diagrams showing the process for cutting the nano tip by an energy beam in the fabrication method of the nano tip according to a second embodiment of the present invention.

FIGS. 3(A) and 3(B) are schematic diagrams showing the process for cutting the nano tip by the energy beam in the fabrication method of the nano tip according to a second embodiment of the present invention. In the present embodiment, the bonded carbon nanotube or the nano rod that is changed to be vertical by exposure to the energy beam may be cut to a required length.

Generally, the high-powered ion beam has the feature of cutting the surface where the beam is scanned. By using the feature, the carbon nanotube 12 (or nano rod) that is aligned along the protruding direction of the end of the supporting holder 20 may be cut to the short carbon nanotube 12' (or nano rod) when the ion beam is scanned in the lengthwise direction of the carbon nanotube 12 (or nano rod) with the focus set at a proper location within the carbon nanotube 12 (or nano rod). The length to be cut off is proportional with the cutting depth D of the beam. Therefore, the length to be cut may be adjusted by adjusting the cutting depth D of the beam. Moreover, the length to be cut may be varied by adjusting the intensity of the beam even under the condition of the same focus and cutting depth of the beam.

Figure 4:
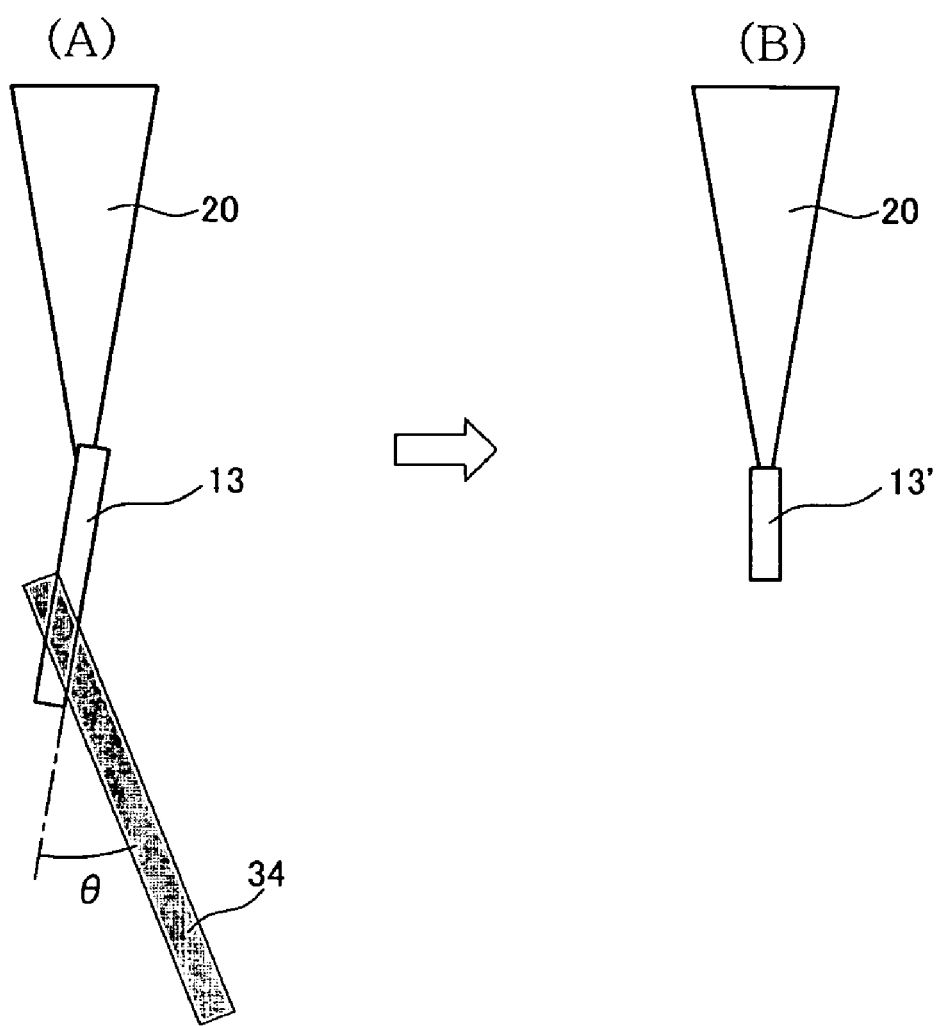
FIGS. 4(A) and 4(B) are schematic diagrams showing the process for cutting the nano tip by an energy beam in the fabrication method of the nano tip according to a third embodiment of the present invention.

FIGS. 4(A) and 4(B) are schematic diagrams showing the process for cutting the nano tip by the energy beam in the fabrication method of the nano tip according to a third embodiment of the present invention.

FIG. 4(A) schematically illustrates that the ion beam 34 is scanned at a predetermined angle (θ) with respect to the lengthwise direction of the carbon nanotube 13 so as to cut off the carbon nanotube 13 at the scanned area. The figure shows an exemplary method of forming the remaining carbon nanotube 13' (or nano rod) after cutting the carbon nanotube 13 (or nano rod) at a predetermined location where the ion beam is scanned at a predetermined oblique angle.

Figure 5:
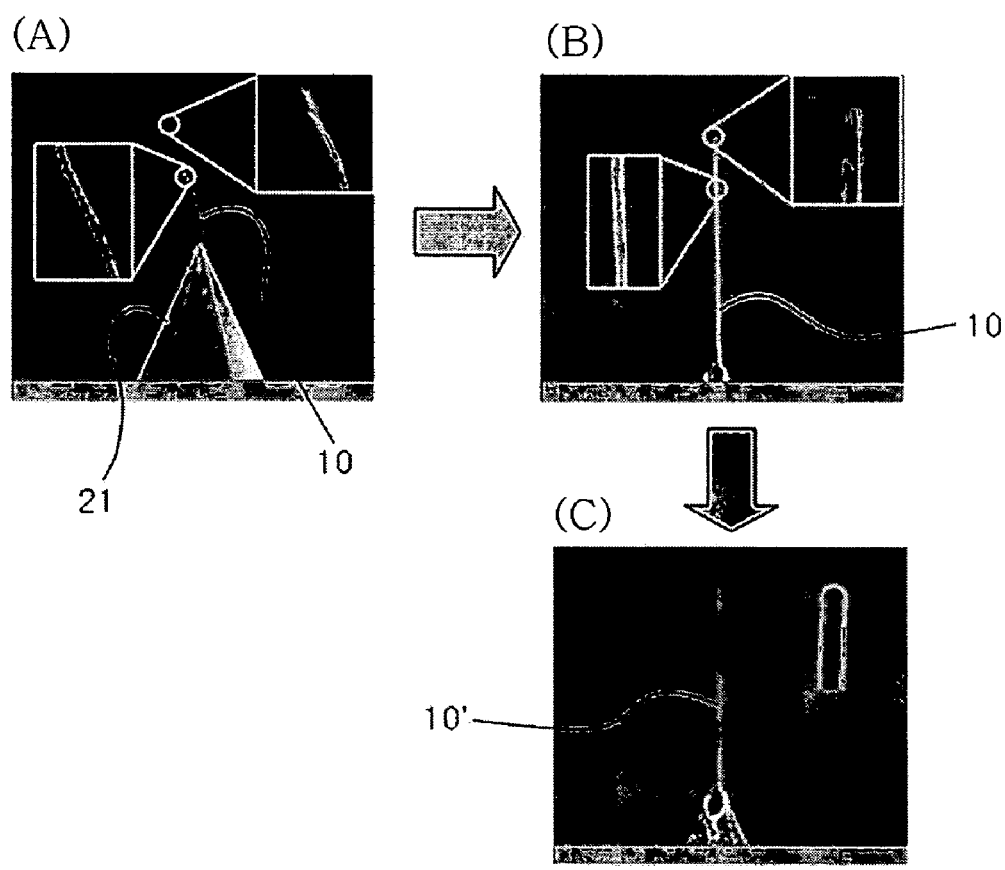
FIGS. 5(A) to 5(C) are photographs showing the change in the perpendicularity, the surface condition, and the end shape of the tip by focused ion beam scanning in the fabrication method of the nano tip according to the first embodiment of the present invention.

FIGS. 5(A) to 5(C) are photographs showing the change in the perpendicularity, the surface condition, and the end shape of the tip by focused ion beam scanning in the fabrication method of the nano tip according to the first embodiment of the present invention. In FIGS. 5(A) to 5(C), an exemplary experiment shows that the curved carbon nanotube 10 in the initial state inside the focused ion beam device becomes perpendicular and straightened by the focused ion beam. In the above experiment, the carbon nanotube 10 shown in FIG. 5(B) results from 30 seconds of exposure to the focused ion beam with a voltage of 30 KV and a current of 10 pA, and FIG. 5(C) shows the result of an additional 30 seconds of exposure under the same conditions.

FIG. 5(A) shows the initial state of the carbon nanotube 10 bonded to the silicon tip 21. Here the carbon nanotube 10 has a split shape at its end, and a few nanotubes appear to be bound into a bundle. Also, the carbon nanotube 10 is seen to be curved at the middle thereof.

FIG. 5(B) shows the result from a predetermined duration of the focused ion beam scanning. The end of the carbon nanotube 10 is seen to be rounded and more blunt. Also, the carbon nanotube 10 is observed to be straightened vertically from the silicon tip 21. The curved area at the middle of the carbon nanotube 10 is quite straightened, and the bundled carbon nanotube 10 made of a few strings in the initial state is seen to change to a single carbon nano rod. Generally, in the case that the carbon nanotube 10 is straightened as such, the crystalline carbon nanotube 10 is expected to change to the non-crystalline carbon nano rod on the whole. Also, impurities attached on the surface of the carbon nanotube 10 and a rough surface thereof are seen to be being changed such that it becomes very smooth.

FIG. 5(C) shows that the end of the carbon nanotube 10' is very close to circular in shape after a longer duration of the focused ion beam scanning. As shown in the exploded inset in FIG. 5(C), the carbon nanotube 10' changes to be more uniform in thickness than the initial carbon nanotube 10.

Figure 6:
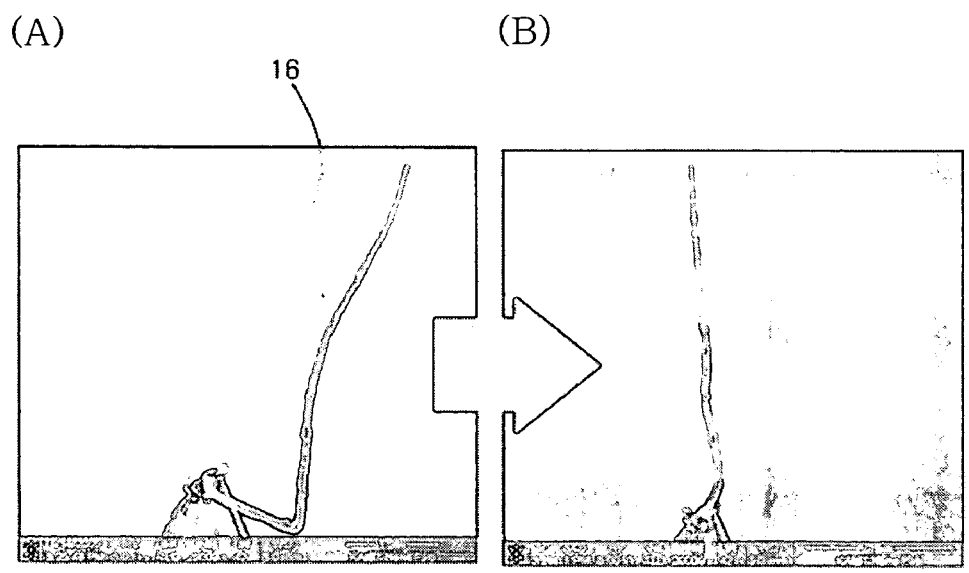
FIGS. 6(A) and 6(B) are photographs showing one exemplary nano tip that is changed in shape from the carbon nanotube by ion beam scanning according to the process shown in FIGS. 2(A) and 2(B).

FIGS. 6(A) and 6(B) are photographs showing one exemplary nano tip that is changed in shape from the carbon nanotube by the ion beam scanning according to the process shown in FIGS. 2(A) and 2(B).

The fully bent carbon nanotube 16 in FIG. 6(A) appears to be straightened vertically in the FIG. 6(B) by the ion beam scanning. Here, the carbon nanotube used in the experiment is a multi-walled carbon nanotube, and the focused ion beam is applied for 10 seconds at a voltage of 30 KV and a current of 10 pA. The focal point is set at the end of the silicon tip.

FIGS. 7(A) and 7(B) are photographs showing another exemplary nano tip that is changed in shape from the carbon nanotube by ion beam scanning according to the process shown in FIGS. 2(A) and 2(B).

In the above experiment, the focused ion beam is applied for 10 seconds at a voltage of 30 KV and a current of 10 pA. The focal point is set at the end of the silicon tip.

FIG. 7(A) shows a single walled carbon nanotube 17 bonded in a bundle shape on the silicon tip and bent at the tip by almost 90 degree with respect to the silicon tip. When the ion beam is applied for a predetermined duration, the bundle of the carbon nanotubes 17 is aligned along the direction of the ion beam and becomes straightened vertically, as seen in FIG. 7(B). Also, it is seen that some of the single walled carbon nanotubes 17 are dissolved by the ion beam so that the length thereof becomes a little smaller than the initial length.

FIGS. 8(A) to 8(D) are photographs showing the nano tip cut by the process shown in FIGS. 3(A) and 3(B). The figures show the result of one exemplary experiment for cutting the bonded carbon nanotube (or nano rod) by applying the ion beam in the lengthwise direction as explained in the process shown in FIGS. 3(A) and 3(B).

Figure 8:
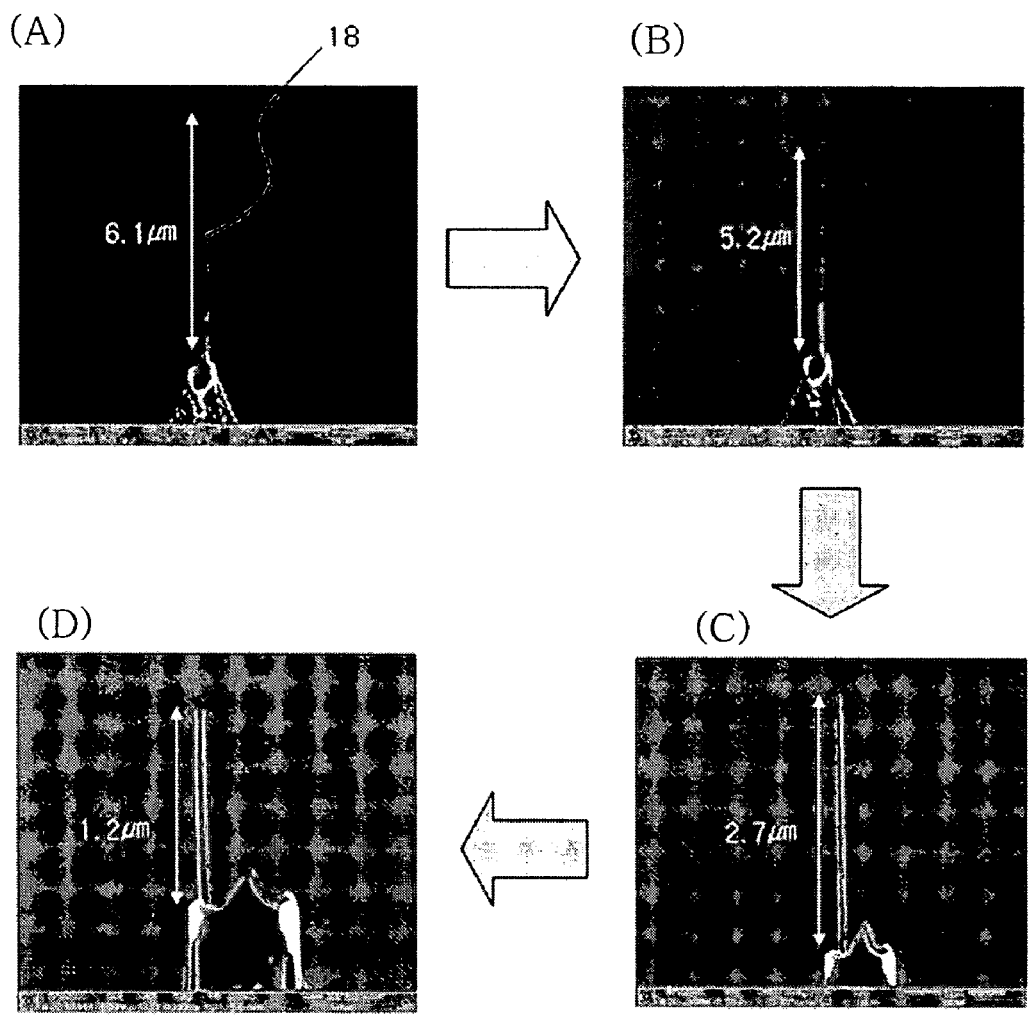
FIGS. 8(A) to 8(D) are photographs showing the nano tip that is cut by the process shown in FIGS. 3(A) and 3(B).

In the experiment of FIG. 8(B), the focused ion beam is applied at a voltage of 30 KV and a current of 10 pA. Its focal point is located 6 μm above the protrusion of the silicon tip, and its cutting depth is set at around 1 μm. The results from the respective cutting depth of the scanning ion beam set at 2 μm and 1 μm successively under the same condition are shown in FIG. 8(C) and FIG. 8(D), respectively. The exposure is set automatically by the device and takes approximately 10 to 15 seconds in each step.

The experiments show that the carbon nanotube 18 with an initial length of about 6.1 μm is successively cut short step by step. From the experiments, it is ascertained that the cutting depth may be controlled by changing the scanning conditions of the ion beam such as scanning depth or beam quantity, and that the carbon nanotube may be cut to a required length. In the process, no significant changes are shown in the external shape of the carbon nanotube (or nano rod) except the length thereof.

Figure 9:
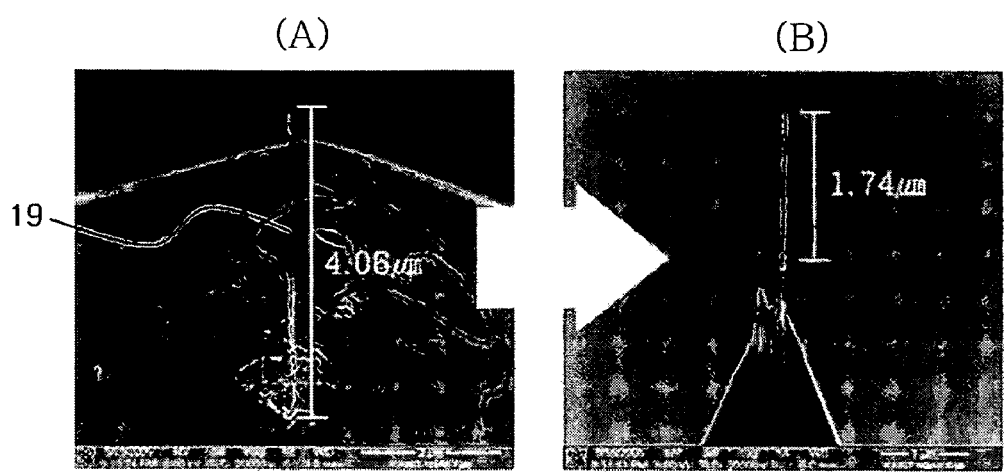
FIGS. 9(A) and 9(B) are photographs showing the nano tip that is cut by the process shown in FIGS. 4(A) and 4(B).

FIGS. 9(A) and 9(B) are photographs showing the nano tip cut by the process shown in FIGS. 4(A) and 4(B). The process to cut off the carbon nanotube 19 (or nano rod) was carried out in FIG. 9 by positioning the ion beam at an oblique angle with respect to the carbon nanotube 19 (or nano rod) and placing the focal point to be within the carbon nanotube 19 (or nano rod). Shown is the result from the condition that the focal point is set at the location where the carbon nanotube is desired to be cut, and the ion beam is scanned for 10 seconds at a voltage of 30 KV and a current of 10 pA.

In FIG. 9(A), in order to confirm the alignment of the carbon nanotube 19, the electron beam device reads the position to be measured, and then the focal point of the ion beam is relocated according to the position. The ion beam is set very low in intensity so as to not align the carbon nanotube in the direction of the ion beam. In the cutting mode, the ion beam with a high intensity is scanned instantaneously while focused at the focal depth of 100 nm. FIG. 9 shows the carbon nanotube 19 (or nano rod) cut off by this process.

Figure 10:
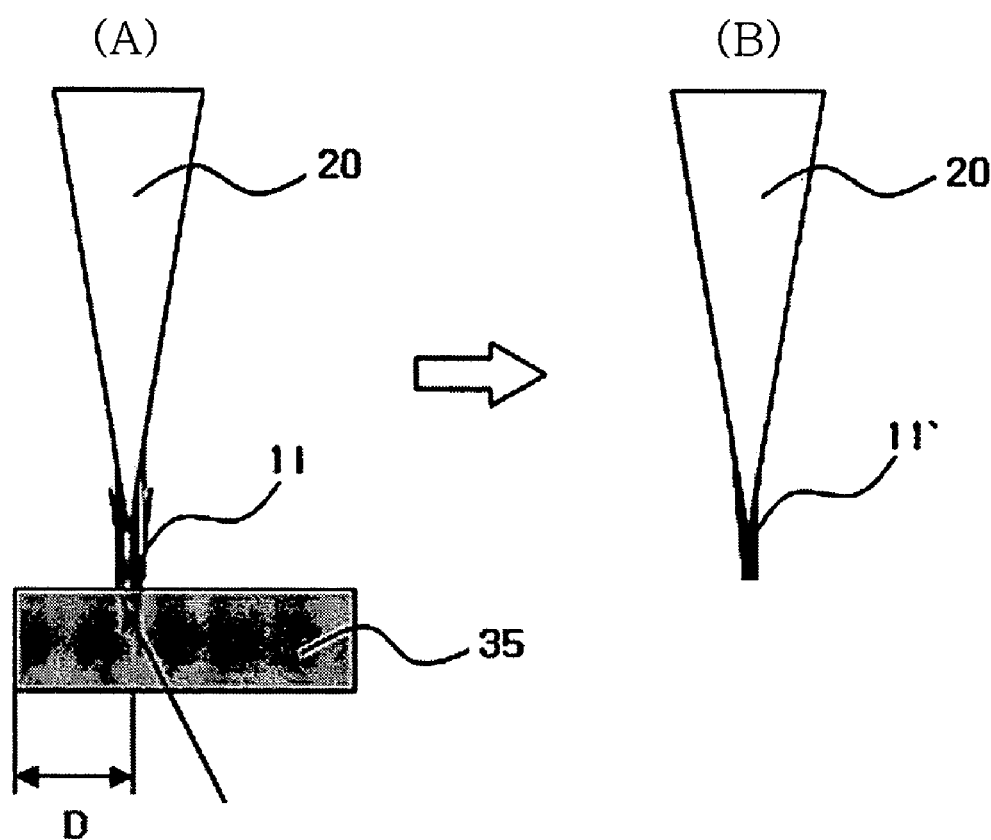
FIGS. 10(A) and 10(B) are schematic diagrams showing the process for cutting the nano tip by energy beam in the fabrication method of the nano tip according to a fourth embodiment of the present invention.

FIGS. 10(A) and 10(B) are schematic diagrams showing the process for cutting the nano tip by an energy beam in the fabrication method of the nano tip according to a fourth embodiment of the present invention.

Figure 7:
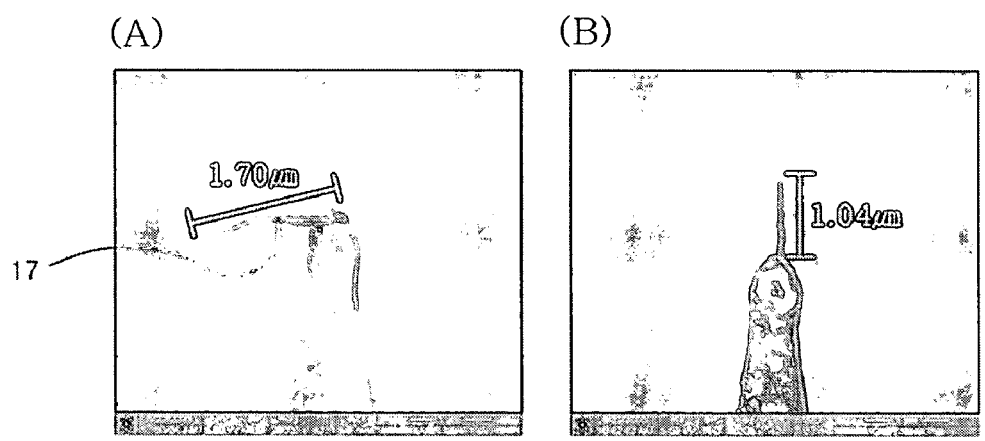
FIGS. 7(A) and 7(B) are photographs showing another exemplary nano tip that is changed in shape from the carbon nanotube by ion beam scanning according to the process shown in FIGS. 2(A) and 2(B).

As shown in FIG. 10(A), while multi-walled carbon nanotubes 11 are stuck to the end of the supporting holder 20 in a shape of a lump, the end portion of the carbon nanotubes 11 may be cut by scanning the ion beam with a processing mode in a transverse direction with respect to the length of the carbon nanotubes 11 from the side thereof, without being aligned as shown in FIG. 7. The depth of focus may be deeper than the diameter of the carbon nanotubes 11, which is measured from the end of the carbon nanotubes 11. FIG. 10(B) shows the result of the process.

Since the carbon nanotubes 11 are cut by scanning the ion beam from the side before being aligned by the ion beam, the chance of alteration from crystalline to non-crystalline may be minimized. In addition, the supporting holder supporting the carbon nanotubes can avoid being damaged from the ion beam.

Figure 11:
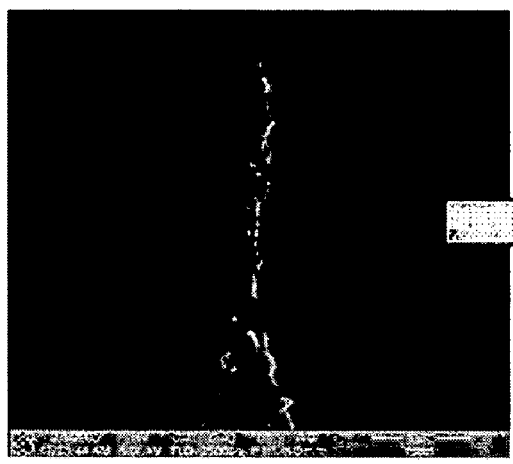
FIGS. 11(A) and 11(B) are photographs showing the nano tip that is cut by the process shown in FIGS. 10(A) and 10(B).
Figure 11:
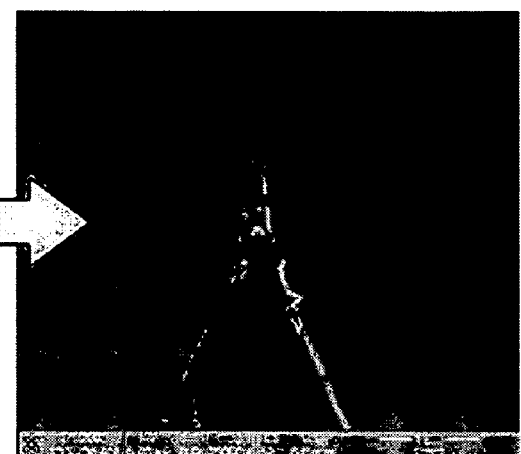

FIGS. 11(A) and 11(B) are photographs showing the nano tip cut by the process shown in FIGS. 10(A) and 10(B).

Figure 12:
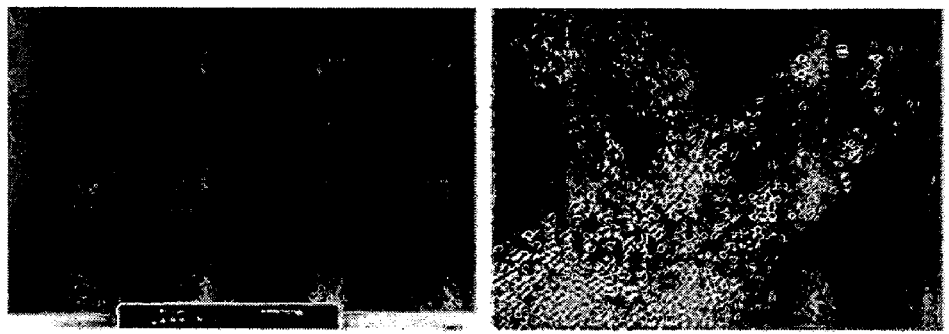
FIGS. 12(A) and 12(B) are TEM photographs showing an alteration from a crystalline wall of a carbon nanotube to non-crystalline carbon as a result of being exposed to an ion beam.
Figure 12:
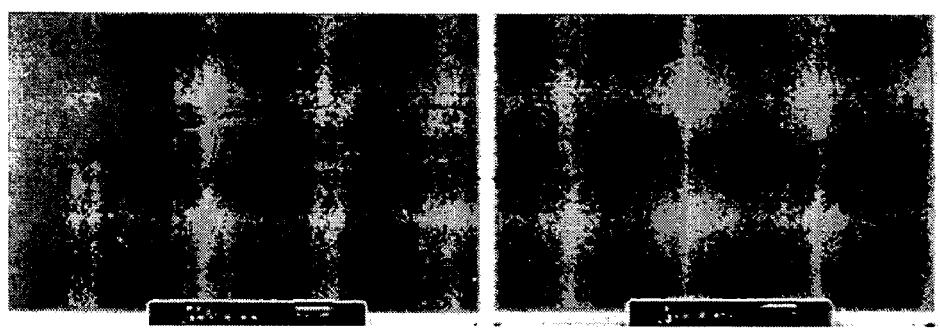

FIGS. 12(A) and 12(B) are transmission electron microscopy (TEM) photographs showing an alteration from a crystalline wall of a carbon nanotube to a non-crystalline carbon as a result of being exposed to an ion beam. FIG. 12(A) shows the crystalline wall of the carbon nanotube before being exposed to the ion beam, and FIG. 12(B) shows the non-crystalline amorphous carbon. The degree of non-crystallinity becomes higher as the intensity of the beam scanned becomes stronger.

Although embodiments of the present invention have been described in detail hereinabove, it should be clearly understood that many variations and/or modifications of the basic inventive concepts taught herein will still fall within the spirit and scope of the present invention, as defined by the appended claims.

What is claimed is:

1. A fabrication method of a nano tip, the nano tip being attached to a mechanical or electrical device and that is usable for detecting surface signals or biological and chemical signals or is usable as a source of a scanning energy beam, comprising: providing a supporting holder that is fixed at one end thereof to the mechanical or electrical device; bonding a carbon nanotube to the free end of the supporting holder, the carbon nanotube has one lengthwise end thereof fixed to the supporting holder; and modifying the property of at least a part of the carbon nanotube from a crystalline to a non-crystalline by scanning an energy beam to the carbon nanotube.

2. The fabrication method of a nano tip of claim 1, wherein the energy beam is controllable in the scanning direction thereof, and is one selected from the group including an ion beam, an electron beam, an X-ray, and a laser beam.

3. The fabrication method of a nano tip of claim 1, wherein scanning the energy beam to the carbon nanotube is scanning the energy beam in a manner such that the whole carbon nanotube is exposed to the energy beam.

4. The fabrication method of a nano tip of claim 1, further comprising cutting the carbon nanotube by scanning the energy beam to a part of the carbon nanotube.

5. The fabrication method of a nano tip of claim 4, wherein cutting the carbon nanotube is focusing the energy beam at the carbon nanotube to be cut and cutting off a part of the carbon nanotube by scanning the energy-beam in the lengthwise direction of the carbon nanotube.

6. The fabrication method of a nano tip of claim 4, wherein cutting the carbon nanotube is cutting off a part of the carbon nanotube by scanning the energy beam in the transverse direction with respect to the length of the carbon nanotube from the side of the carbon nanotube to be cut.

7. The fabrication method of a nano tip of claim 1, wherein the carbon nanotube is changed to be smoother on the exposed surface thereof by scanning the energy beam to the carbon nanotube.

8. The fabrication method of a nano tip of claim 1, wherein the end morphology of the carbon nanotube is changed to a round shape at the exposed end thereof by scanning the energy beam to the carbon nanotube.

9. The fabrication method of a nano tip of claim 1, wherein the carbon nanotube exposed to the energy beam is changed to be straightened in the lengthwise direction thereof by scanning the energy beam to the carbon nanotube.

10. The fabrication method of a nano tip of claim 1, wherein the energy beam is scanned such that a depth of focus of the energy beam is deeper than a diameter of the carbon nanotube, the depth of focus being measured from the end of the carbon nanotube.

11. The fabrication method of a nano tip of claim 1, wherein scanning the energy beam to the carbon nanotube is modifying the bundle of the carbon nanotubes to a single nano rod by bonding several carbon nanotubes in a bundle shape to the supporting holder and then scanning the energy beam thereto.

12. The fabrication method of a nano tip of claim 1, wherein the supporting holder is made of a conductor.

13. A nano tip fabricated by the method according to claim 1.

* * * * *